(12) United States Patent
Lou

(10) Patent No.: US 6,403,486 B1
(45) Date of Patent: Jun. 11, 2002

(54) METHOD FOR FORMING A SHALLOW TRENCH ISOLATION

(75) Inventor: Chine-Gie Lou, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/845,482

(22) Filed: Apr. 30, 2001

(51) Int. Cl.[7] ............................................. H01L 21/302
(52) U.S. Cl. ....................... 438/694; 438/697; 438/700; 438/723; 438/724
(58) Field of Search ................................ 438/694, 695, 438/657, 723, 724, 725, 719, 756, 757, 700

(56) References Cited

U.S. PATENT DOCUMENTS

| | | | |
|---|---|---|---|
| 5,677,233 A | 10/1997 | Abiko | 437/67 |
| 5,834,358 A | 11/1998 | Pan et al. | 438/424 |
| 5,872,045 A | 2/1999 | Lou et al. | 438/432 |
| 5,945,724 A * | 8/1999 | Parekh et al. | 257/510 |
| 6,025,249 A | 2/2000 | Kuo | 438/426 |
| 6,174,785 B1 * | 1/2001 | Parekh et al. | 438/424 |
| 6,228,727 B1 * | 5/2001 | Lim et al. | 438/296 |
| 6,265,285 B1 * | 7/2001 | Tseng | 438/424 |
| 6,281,082 B1 * | 8/2001 | Chen et al. | 438/296 |

* cited by examiner

*Primary Examiner*—Benjamin L. Utech
*Assistant Examiner*—Binh X. Tran
(74) *Attorney, Agent, or Firm*—George O. Saile; Stephen B. Ackerman; Sevgin Oktay

(57) ABSTRACT

A method is disclosed to form a shallow trench isolation (STI) without reverse short channel effect. This is accomplished by forming oxidized polysilicon spacers in the dielectric layers above the trench, while also employing a thermal oxide liner on the inside walls of the trench in the substrate. The polyoxide spacers and the thermal oxide liner together prevent the undercutting at the corners or shoulders of the trench, thereby avoiding the common problem of having reverse short channel effect.

27 Claims, 4 Drawing Sheets

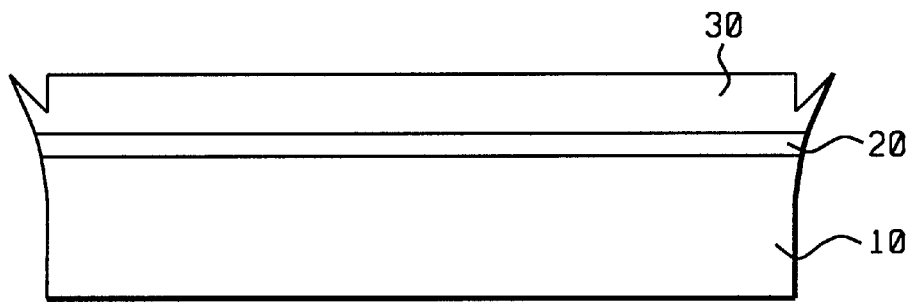
FIG. 1a – Prior Art
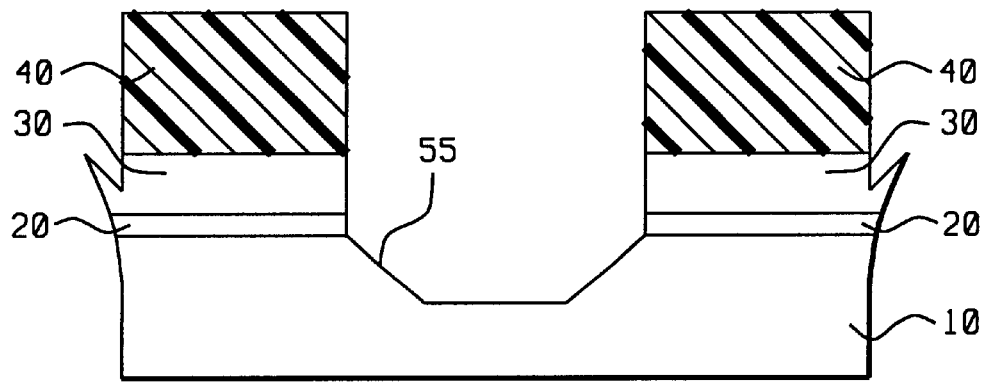
FIG. 1b – Prior Art
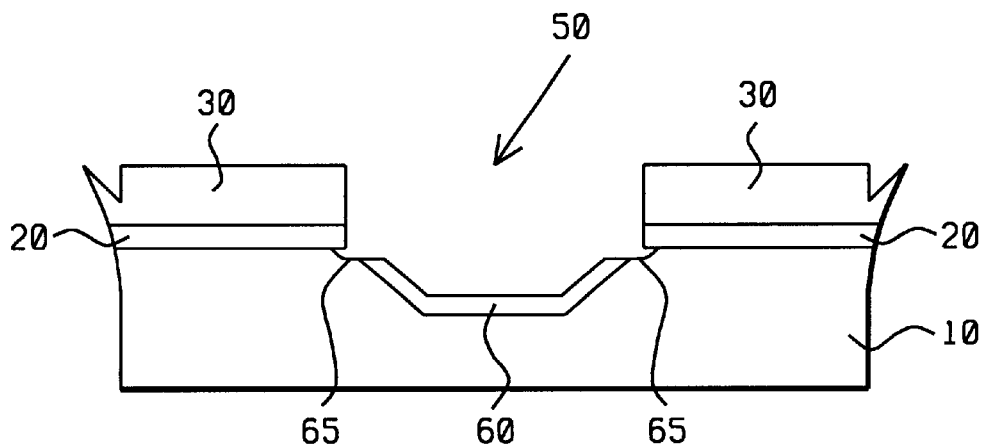
FIG. 1c – Prior Art

METHOD FOR FORMING A SHALLOW TRENCH ISOLATION

BACKGROUND OF THE INVENTION (1) Field of the Invention

The present invention relates to semiconductor devices in general, and more particularly, to a method of forming shallow trench isolation (STI) without reverse short channel effect.

(2) Description of the Related Art

In STI art, it is often the case that when forming isolation trenches in semiconductor substrates, the corners of the trenches are undercut. Such undercutting can cause junction leakage and the associated undesirable phenomenon, which is sometimes referred to as "Kink" effect. It is disclosed later in the embodiments of the present invention a method of avoiding the formation of such undercuts, when fabricating shallow trench isolation.

Trench structures in semiconductors are employed for various purposes, such as for replacement of LOCOS (local oxidation of silicon) isolation for like devices within the same tub in a CMOS device, or for isolation of n-channel from p-channel devices, or as trench-capacitor structures in DRAMS, or for isolation of bipolar devices. Shallow refilled trenches are used primarily for isolating devices of the same type, and trench-capacitor structures are normally fabricated with narrow, deep trenches. By virtue of the shape of a trench, there usually results a sharp corner or shoulder where the trench intersects with the surface within which the trench is formed. Consequently, concentration of the electric-field occurs at the sharp corner region which in turn causes the lowering of the threshold voltage of the corner region, and this part of the device turns on at a lower voltage than does the interior portion of the device. As is known in the art, the problem is exacerbated if there is a downward step, i.e., undercut, in the field oxide adjacent the trench. The larger the step, the lower the threshold voltage, and unwanted subthreshold conduction begins at progressively lower values of the gate voltage. It is disclosed later in the embodiments of this invention a method of eliminating these common but undesirable steps, or, undercuts, at the trench corners and shoulders.

A conventional method of forming a shallow trench isolation is shown in prior art FIGS. 1a–1c. First, as shown in FIG. 1a, a substrate (10) is provided. Then, a pad oxide layer (20) is formed over substrate (10) using a thermal oxidation process. The pad oxide layer can be, for example, a silicon dioxide layer. Thereafter, silicon nitride ($Si_3N4$) layer (30) is formed over the pad oxide layer using a low pressure chemical vapor deposition (LPCVD)) method.

Photoresist layer (40) is next formed, as shown in FIG. 1b, over silicon nitride layer (30), and then a photolithographic process is used to form a pattern on the silicon nitride layer (30). Then, silicon nitride layer (30) is anisotropically etched to expose portions of the pad oxide layer using a dry etching method. Similarly, using photoresist layer (40) and photolithographic processing again, a pattern is formed on the pad oxide layer (20) and substrate (10). Then, exposed pad oxide layer (20) is anisotropically etched by a dry etching method. Etching continues down into substrate (10), and finally forming a trench (18) having interior surfaces (55) that exposes portions of the substrate (10)

Next, as shown in FIG. 1c, photoresist layer (40) is removed to expose the silicon nitride layer. Then, a liner oxide layer (60) is formed at a high temperature using a thermal oxidation process. Liner oxide layer (60) covers the interior surfaces (55) of the trench (50), and has connection with pad oxide layer (20) at the top upper corner of trench (50).

In the conventional method, the thickness of both the liner oxide layer and the pad oxide layer is roughly the same. Therefore, due to the over-exposure of the substrate at the upper corner of the trench in a subsequent pad oxide layer removing process, an undercut as shown by reference numeral (65) in FIG. 1c leads to a Kink effect at the upper corner location. Hence, besides generating sub-threshold current in the device, a corner parasitic MOSFET will also be formed, leading to substantial current leakage in the device, hence reverse short channel effect.

In order to alleviate this type of Kink effect, Kuo et al, disclose in U.S. Pat. No. 6,025,249 a method of manufacturing a shallow trench isolation structure comprising the steps of forming a masking layer over a substrate; then, patterning the masking layer to form an opening; thereafter, forming an oxide layer over the surface of the masking layer and the opening; and, etching hack the oxide layer to form oxide spacers on the sidewalls of the masking layer. Subsequently, the substrate is etched downward along the side edges of the oxide spacers to form a trench. Thereafter, the oxide spacers are removed to expose the substrate surface formerly blocked by the oxide spacers. Finally, a liner oxide layer is formed on the trench surface over the substrate. In this manner, a smoother and thicker liner oxide layer is formed, and device current leakage due to subthreshold current and associated kink effect is avoided.

A different method of forming a shallow trench isolation is disclosed in U.S. Pat. No. 5,872,045 by Lou, et al. The method involves forming shallow trenches in a silicon substrate having a silicon nitride layer on the surface. After selectively oxidizing silicon exposed in the trenches, a second silicon nitride layer is deposited, and a composite polysilicon layer consisting of an undoped polysilicon layer and a gradient-doped polysilicon layer is deposited filling the trenches. The composite polysilicon layer is next chemical/mechanically polished back. The undoped polysilicon remaining in the trenches is then thermally oxidized to eliminate undercutting at the edges of the wide trenches, and the silicon nitride layers are removed by selectively etching to complete the shallow trench isolation.

Another method of forming isolation regions is shown in U.S. Pat. No. 5,834,358 by Pan et al., where they employ a silicon-comprising layer adjacent a trench during planarization of an oxide fill within the trench. An overhanging oxide sidewall is formed along a lateral edge of a trenched isolation region, the overhanging oxide sidewall overlapping an upper surface of a substrate immediately adjacent the trenched isolation region. An oxide plug is formed comprising a recessed portion below a substrate upper surface and an elevated portion above the substrate upper surface. The elevated portion comprising a ledge which extends over the substrate upper surface and has a top surface and a substantially vertical lateral edge side surface. Further, the plug may be within a substrate, the oxide plug having a recessed portion below a substrate upper surface and an elevated portion above the substrate upper surface, the elevated portion comprising a ledge extending over the substrate upper surface and abutting a polysilicon layer.

Still another method of forming an isolation oxide is disclosed in U.S. Pat. No. 5,677,233 where the oxide is formed from a silicon nitride layer deposited over a mask after removal of a side wall by using a polishing technique, thereby preventing the isolating oxide from undesirable undercutting during an etching step.

In the present invention, a method is described where the integrity of the trench edge, or, corner, is protected from unwanted process induced alterations by employing polyoxide spacers at said corner.

SUMMARY OF THE INVENTION

It is therefore an object of this invention to provide a method of forming a shallow isolation trench (STI) without kink effect.

It is another object of this invention to provide a method of forming an STI having reduced undercutting at the shoulder of the trench by protecting the trench edge with oxidized polysilicon spacers in the dielectric layers overlying the trench in the substrate.

It is yet another object of this invention to provide a method of forming an STI having reduced reverse short channel effect by employing polyoxide spacers above the trench edge and thermal oxide liner on the inside walls of the trench in the substrate.

These objects are accomplished by providing a substrate; forming a first oxide layer over said substrate; forming a nitride layer over said first oxide layer; forming a second oxide layer over said nitride layer; patterning said second oxide, said nitride and said first oxide layers to form an opening in said layers reaching the surface of said substrate; forming a conformal polysilicon layer over said substrate including over the inside walls of said opening; forming a polyoxide layer by oxidizing said polysilicon layer; forming polyoxide spacers along the vertical walls of said opening while at the same time etching away said polyoxide layer from the surface of said substrate and from the bottom wall of said opening, thus exposing the surface of said substrate; etching further said substrate through said opening to form a trench in said substrate; forming a thermal oxide liner over said substrate, including over said polyoxide spacers in said opening and over the inside walls of said trench; forming a trench oxide over said substrate, including over said opening and said trench in said substrate; planarizing said trench oxide; and stripping said second oxide, nitride and said first oxide layers to form said shallow trench isolation of the invention.

BRIEF DESCRIPTION OF THE DRAWINGS

FIG. 1a is a partial cross section of a semiconductor substrate showing the forming of a pad oxide layer and a nitride layer according to prior art.

FIG. 1b shows the patterning of the pad oxide and nitride layers of FIG. 1a, and the subsequent forming of a trench, according to prior art.

FIG. 1c shows the forming of an oxide liner along the walls of the trench of FIG. 1b, and the resulting undercut at the edge of the trench, according to prior art.

DESCRIPTION OF THE PREFERRED EMBODIMENTS

Figure 2A:
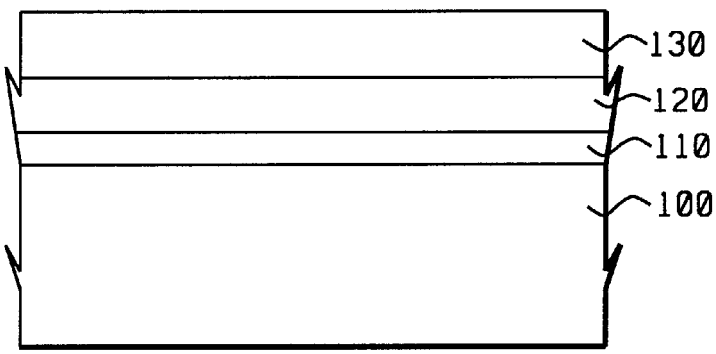
FIG. 2a is a partial cross section of a semiconductor substrate showing the forming of a first oxide layer, followed by a nitride layer, and then a second oxide layer, according to the present invention.
Figure 2B:
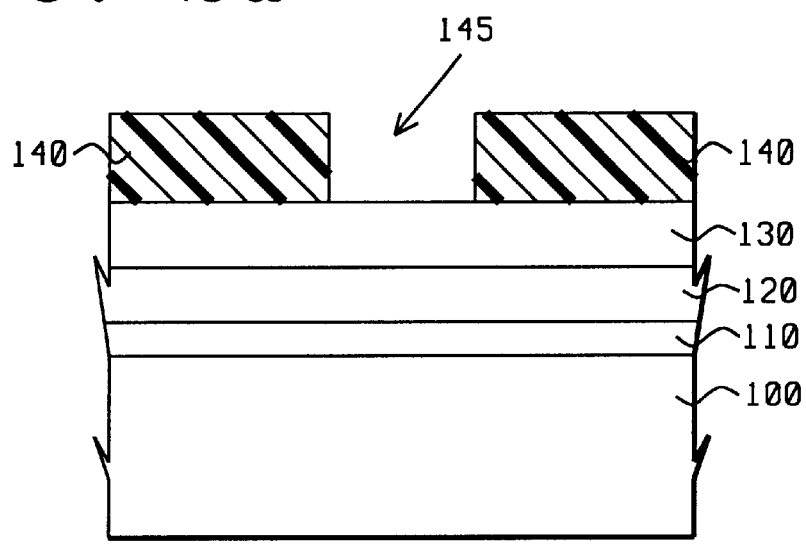
FIG. 2b is a partial cross section of a semiconductor substrate showing the patterning of a photoresist layer for delineating the area in which a trench will later be formed in the substrate of FIG. 2a, according to this invention.

Referring now to the drawings, specifically to FIGS. 2a–2i, there is shown a method of forming a shallow trench isolation (STI) without reverse short channel effect. This is accomplished by forming oxidized polysilicon spacers in the dielectric layers above the trench, while also employing a thermal oxide liner on the inside walls of the trench in the substrate. The polyoxide spacers and the thermal oxide liner together prevent the undercutting at the corners or shoulders of the trench, thereby avoiding the common problem of having reverse short channel effect.

More specifically, in FIG. 2a, substrate (100), preferably silicon, is provided having predetermined active areas and passive regions. Prior to forming the trenches in the passive regions according to the present invention, a first oxide layer (110) is formed through the decomposition of tetraethyl orthosilicate (TEOS) at a temperature between about 690 to 720° C. It is preferred that the thickness of the first TEOS layer is between about 150 to 1500 Å.

Next, nitride layer (120) is formed over the first oxide layer preferably by reacting dichlorosilane ($SiCl_2H_2$) with ammonia ($NH_3$) in an LPCVD at a temperature between about 650 to 690° C. The preferred thickness of nitride layer (120) is between about 1500 to 1800 Å. This is followed by the forming of a second oxide layer, preferably TEOS layer (130) in FIG. 2b, and having a thickness between about 2000 to 6000 Å.

Figure 2C:
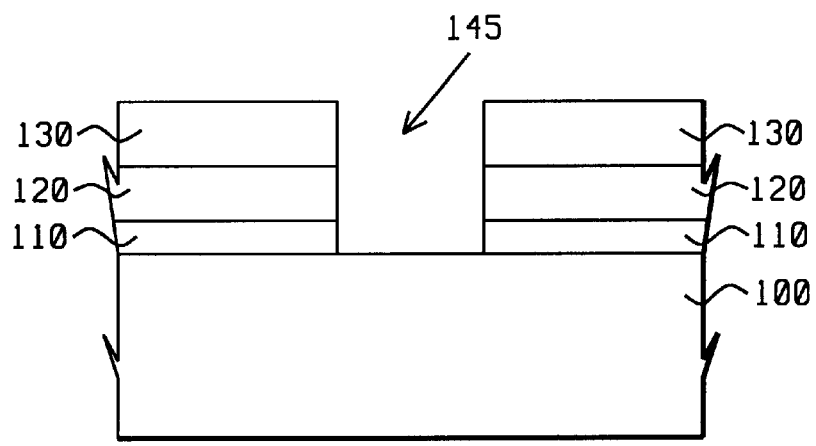
FIG. 2c is a partial cross section of a semiconductor substrate showing the transfer of the opening in the photomask of FIG. 2b into the underlying dielectric layers, according to this invention.

Photoresist layer (140) is next formed over the second oxide layer and patterned to delineate the trench area to be formed in the underlying substrate. Thus, in FIG. 2b, patterned opening (145) correspond to the area where a trench is to be formed. The thickness of photoresist layer (140) is between about 0.5 to 2.5 micrometers ($\mu$m). It will be noted that the photoresist layer that is used here is thinner than with the conventional STI methods to provide a better resolution. Using patterned layer (140) as a photoresist mask, second oxide layer (130), nitride layer (120) and first oxide layer (110) are then dry etched to transfer opening (145) from the photomask into these dielectric layers until a portion of the underlying silicon substrate is exposed at the bottom of the opening, as seen in FIG. 2c. The etching can be accomplished by reactive ion etching (RIE).

Figure 2D:
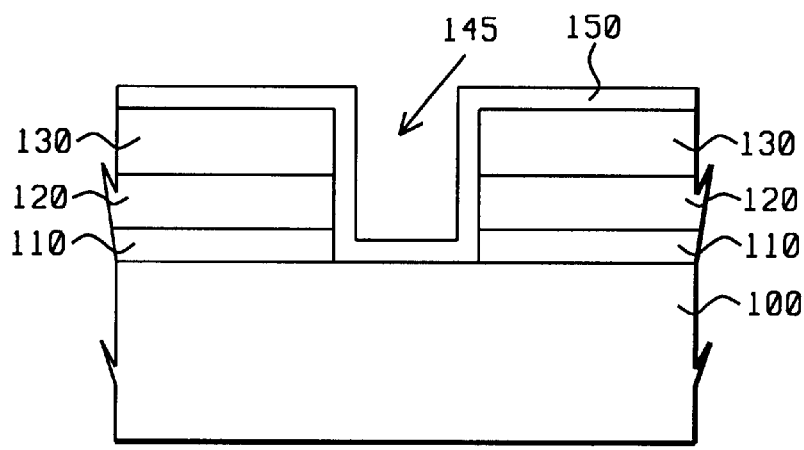
FIG. 2d is a partial cross section of a semiconductor substrate showing the forming of a polysilicon layer on the inside walls of the opening of FIG. 2c, according to this invention.
Figure 2E:
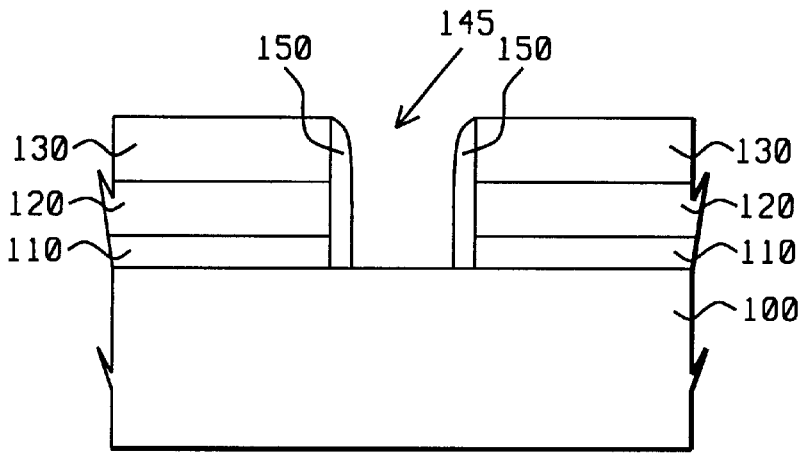
FIG. 2e is a partial cross section of a semiconductor substrate showing the forming of polyoxide spacers in the opening of FIG. 2d, according to this invention.

Before continuing to etch further so as to form a shallow trench in the underlying substrate, first, and as a main feature and key aspect of the present invention, a conformal layer of polysilicon (150) is formed over the inside walls of opening (145) a shown in FIG. 2d. This is accomplished through methods including but not limited to Low Pressure Chemical Vapor Deposition (LPCVD) methods, Chemical Vapor Deposition (CVD) methods and Physical Vapor Deposition (PVD) sputtering methods employing suitable silicon source materials, preferably, through an LPCVD method employing silane $SiH_4$ as a silicon source material at a temperature range between about 550 to 620° C. The preferred thickness is between about 100 to 1000 Å. Then, as another important step, polysilicon layer (150) is wet oxidized to form a polyoxide layer. This polyoxide layer is next etched to form polyoxide spacers (150) shown in FIG. 2e, which will be important in protecting the edges of the trench from being damaged and undercut as described below. The etching to form the spacers is accomplished with a recipe comprising $Cl_2$ and HBr.

Figure 2F:
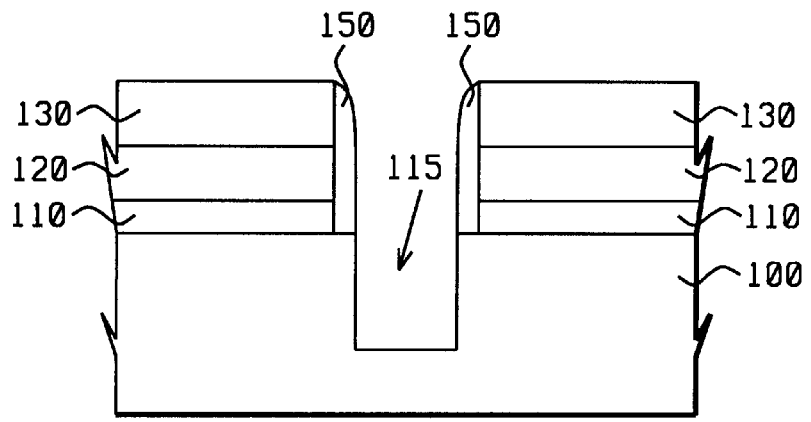
FIG. 2f is a partial cross section of a semiconductor substrate showing the forming of the trench of this invention into the underlying substrate, according to this invention.
Figure 2G:
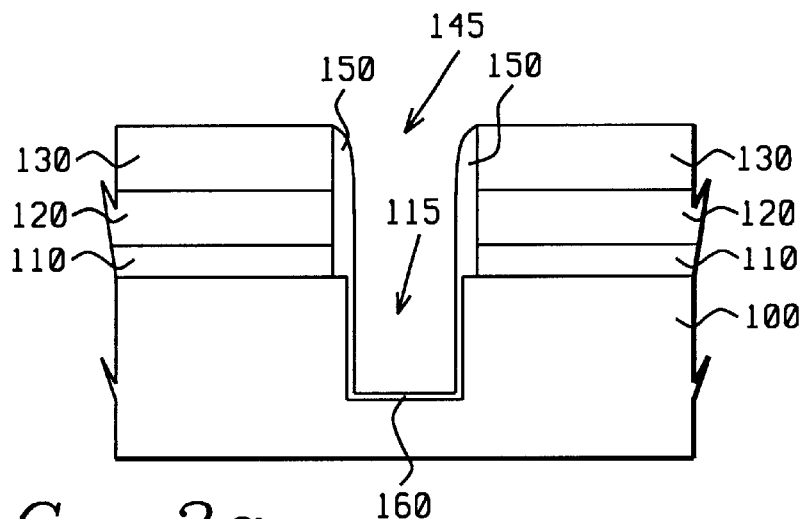
FIG. 2g is a partial cross section of a semiconductor substrate showing the forming of a thermal oxide liner on the inside walls of the trench' as well as on the polyoxide spacers of this invention, according to the present disclosure.

Using spacers (150) to protect the edges, RIE etching is further continued into the substrate to form trench (115), as shown in FIG. 2f. Also, an additional oxide liner is formed over the inside walls of trench (115), as well as over the spacers as seen in FIG. 2g. The thermal oxide is formed by subjecting the silicon walls of the trench to a temperature between about 800 to 1100° C. and until the polyoxide spacers are transformed into thermal oxide spacers.

Figure 2H:
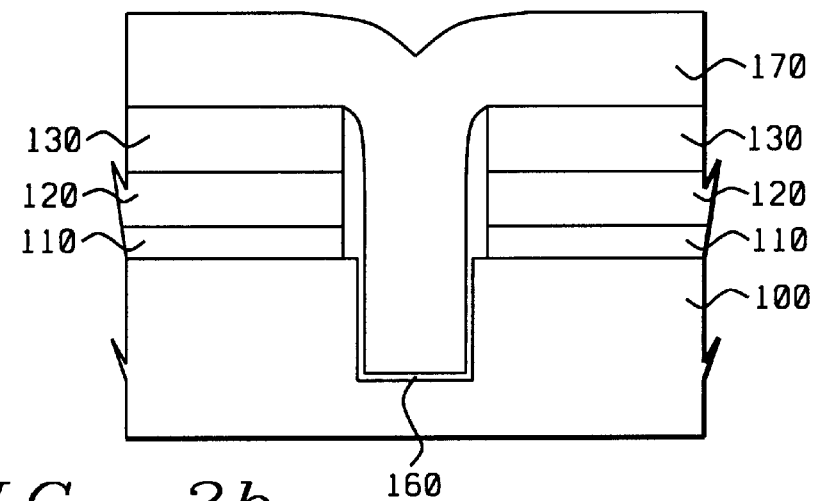
FIG. 2h is a partial cross section of a semiconductor substrate showing the forming of gap fill oxide in the trench of FIG. 2g, according to the present invention.
Figure 2I:
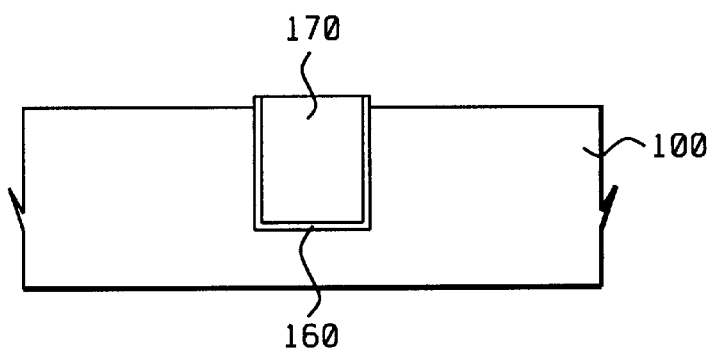
FIG. 2i is a partial cross section of a semiconductor substrate showing the shallow trench of this invention without any undercut at its edge, corner, or shoulder, according to the present disclosure.

Next, trench (115) is filled with trench oxide by depositing high density plasma (HDP) oxide or $O_3$-TEOS oxide as shown in FIG. 2h. Any excess dioxide is then planarized by using chemical mechanical polishing (CMP). Subsequently, nitride layer (120) is removed by using hot phosphoric acid $H_3PO_4$ and first TEOS oxide layer (110) with an oxide stripper. The resulting shallow trench isolation of the invention is shown in FIG. 2i.

It will be noted in FIG. 2i that filling oxide (170) is not below the surface of the surrounding active area so that undercutting at the edge, or corner, or shoulder, as it is sometimes referred to, is prevented; hence the absence of reverse short channel effect that is commonly observed in prior art.

While the invention has been particularly shown and described with reference to the preferred embodiments thereof, it will be understood by those skilled in the art that various changes in form and details may be made without departing from the spirit and scope of the invention.

What is claimed is:

1. A method of forming a shallow trench isolation comprising the steps of:
   providing a substrate;
   forming a first oxide layer over said substrate;
   forming a nitride layer over said first oxide layer;
   forming a second oxide layer over said nitride layer;
   patterning said second oxide, said nitride and said first oxide layers to form an opening in said layers reaching the surface of said substrate;
   forming a conformal polysilicon layer over said substrate including over the inside walls of said opening;
   forming a polyoxide layer by oxidizing said polysilicon layer;
   forming polyoxide spacers along the vertical walls of said opening while at the same time etching away said polyoxide layer from the surface of said substrate and from the bottom wall of said opening, thus exposing the surface of said substrate;
   etching further said substrate through said opening to form a trench in said substrate;
   forming a thermal oxide liner over said substrate, including over said polyoxide spacers in said opening and over the inside walls of said trench;
   forming a trench oxide over said substrate, including over said opening and said trench in said substrate;
   planarizing said trench oxide; and
   stripping said nitride and said first oxide layers to form said shallow trench isolation of the invention.

2. The method of claim 1, wherein said substrate is silicon.

3. The method of claim 1, wherein said first oxide layer is tetraethyl orthosilicate (TEOS).

4. The method of claim 1, wherein said first oxide layer has a thickness between about 150 to 500 Å.

5. The method of claim 1, wherein said nitride layer is formed by reacting dichlorosilane ($SiCl_2H_2$), or silane ($SiH_4$), with ammonia ($NH_3$) in an Low Pressure Chemical Vapor Deposition (LPCVD) at a temperature between about 650 to 690° C.

6. The method of claim 1, wherein said nitride layer has a thickness between about 1500 to 1800 Å.

7. The method of claim 1, wherein said second oxide layer is tetraethyl orthosilicate (TEOS).

8. The method of claim 1, wherein said second oxide layer has a thickness between about 2000 to 6000 Å.

9. The method of claim 1, wherein said forming said conformal polysilicon layer is accomplished through a Low Pressure Chemical Vapor Deposition (LPCVD) method employing silane $SiH_4$ as a silicon source material at a temperature range between about 550 to 620° C.

10. The method of claim 1, wherein said conformal polysilicon layer has a thickness between about 100 to 1000 Å.

11. The method of claim 1, wherein said forming said polyoxide layer is accomplished by oxidation at a temperature between about 800 to 1100° C.

12. The method of claim 1, wherein said forming said polyoxide spacers is accomplished by using an etch recipe comprising $Cl_2$ and HBr.

13. The method of claim 1, wherein said thermal oxide liner has a thickness between about 100 to 1000 Å.

14. The method of claim 1, wherein said forming said trench oxide in said trench is accomplished by depositing High Density Plasma (HDP) oxide or $O_3$-TEOS oxide.

15. The method of claim 1, wherein said stripping said nitride and first oxide layers is accomplished with a recipe comprising hot phosphoric acid $H_3PO_4$ and an oxide stripper.

16. A method of forming a shallow trench isolation comprising the steps of:
   providing a substrate having a plurality of dielectric layers;
   forming a photoresist layer over said plurality of dielectric layers;
   patterning said photoresist layer to form a photoresist mask defining an opening for a shallow trench to be formed in said substrate;
   etching said plurality of dielectric layers through said photoresist mask to form said opening in said layers until a portion of said substrate is exposed;
   removing said photoresist layer;
   forming a polysilicon layer over said substrate including over the inside walls of said opening in said plurality of dielectric layers;

forming a polyoxide layer by oxidizing said polysilicon layer;

forming polyoxide spacers along the vertical walls of said opening while at the same time etching away said polyoxide layer from the surface of said substrate and from the bottom wall of said opening, thus exposing the surface of said substrate;

etching further said substrate through said opening to form a trench in said substrate;

forming a thermal oxide liner over said substrate, including over said polyoxide spacers in said opening and over the inside walls of said trench;

forming a trench oxide over said substrate, including over said opening and said trench in said substrate;

planarizing said trench oxide; and stripping said plurality of dielectric layers to form said shallow trench isolation of the invention.

17. The method of claim 16, wherein said substrate is silicon.

18. The method of claim 16, wherein said plurality of dielectrics comprise first oxide layer, nitride layer and a second oxide layer.

19. The method of claim 16, wherein said first and second oxide layers are tetraethyl orthosilicate (TEOS) having a thickness between about 150 to 500 Å, and 2000 to 6000 Å, respectively.

20. The method of claim 19, wherein said nitride layer is formed by reacting dichlorosilane ($SiCl_2H_2$), or silane ($SiH_4$), with ammonia ($NH_3$) in an Low Pressure Chemical Vapor Deposition (LPCVD) at a temperature between about 650 to 690 C. to a thickness between about 1500 to 1800 Å.

21. The method of claim 16, wherein said forming said polysilicon layer is accomplished through a Low Pressure Chemical Vapor Deposition (LPCVD) method employing silane $SiH_4$ as a silicon source material at a temperature range between about 550 to 620° C.

22. The method of claim 16, wherein said polysilicon layer has a thickness between about 100 to 1000 Å.

23. The method of claim 16, wherein said forming said polyoxide layer is accomplished by oxidation at a temperature between about 800 to 1100° C.

24. The method of claim 16, wherein said forming said polyoxide spacers is accomplished by etching using a recipe comprising $Cl_2$ and HBr.

25. The method of claim 16, wherein said thermal oxide liner has a thickness between about 100 to 1000 Å.

26. The method of claim 16, wherein said forming said trench oxide in said trench is accomplished by depositing High Density Plasma (HDP) oxide or $O_3$-TEOS oxide.

27. The method of claim 16, wherein said stripping said plurality of dielectric layers is accomplished with a recipe comprising hot phosphoric acid $H_3PO_4$ and an oxide stripper.

* * * * *